United States Patent [19]

Nii

[11] Patent Number: 5,279,888

[45] Date of Patent: Jan. 18, 1994

[54] SILICON CARBIDE SEMICONDUCTOR APPARATUS

[75] Inventor: Keita Nii, Kyoto, Japan

[73] Assignee: Rohm Co., Ltd., Kyoto, Japan

[21] Appl. No.: 883,118

[22] Filed: May 14, 1992

[30] Foreign Application Priority Data

Jul. 19, 1991 [JP] Japan .................................. 3-179355

[51] Int. Cl.[5] .............................................. B32B 9/00
[52] U.S. Cl. .................................... 428/209; 428/446; 428/698; 437/34; 437/56; 437/67; 257/613; 257/746
[58] Field of Search ................ 437/67, 200, 40, 34, 437/56; 357/67, 51; 428/446, 698, 209

[56] References Cited

U.S. PATENT DOCUMENTS

| | | | |
|---|---|---|---|
| 4,095,251 | 6/1978 | Dennard et al. | 357/67 |
| 5,086,006 | 2/1992 | Asahina | 437/200 |
| 5,124,779 | 6/1992 | Furukawa et al. | 357/67 |

Primary Examiner—Patrick J. Ryan
Assistant Examiner—Abraham Bahta
Attorney, Agent, or Firm—Wenderoth, Lind & Ponack

[57] ABSTRACT

High concentration polysilicon is grown on the silicon carbide so as to effect the connection through the polysilicon, thereby to obtain a better wiring construction in the connection between silicon carbide conductor basic plate and wiring.

4 Claims, 1 Drawing Sheet

SILICON CARBIDE SEMICONDUCTOR APPARATUS

BACKGROUND OF THE INVENTION

The present invention generally relates to a semiconductor apparatus using silicon carbide, and more particularly, to the wiring construction thereof.

At present, research and development is being carried out on a semiconductor apparatus using silicon carbide as element for environment-proof use (for example, MOSFET, Bip - Tr), a hetero-junction bi-polar transistor (HBT) of high speed, high gain, and the operation thereof is actually confirmed. Also, a transistor using silicon carbide only has been developed.

But the contact between the silicon carbide, and metals such as Al, Mo, Ti and so on to be used as wirings cannot be obtained better.

SUMMARY OF THE INVENTION

Accordingly, the present invention has been developed with a view to substantially eliminating the above discussed drawbacks inherent in the prior art, and has for its essential object to provide a semiconductor apparatus.

Another important object of the present invention is to provide wiring construction suitable for mass production with the silicon carbide and wiring being properly connected in a semiconductor apparatus using silicon carbide.

In accomplishing these and other objects, according to a semiconductor apparatus using silicon carbide of the present invention, a connecting operation is effected through polysilicon between the semiconductor base plate and wiring in the connection between them to improve the connection between them for improving the productivity and the performance of the wiring construction.

As described hereinabove, the wiring construction of the present invention prevents the direct contact between the silicon carbide and the metals so as to improve the contact of the connection construction with the connection between the semiconductor base plate of the silicon carbide and the wiring being provided through the high concentration polysilicon.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
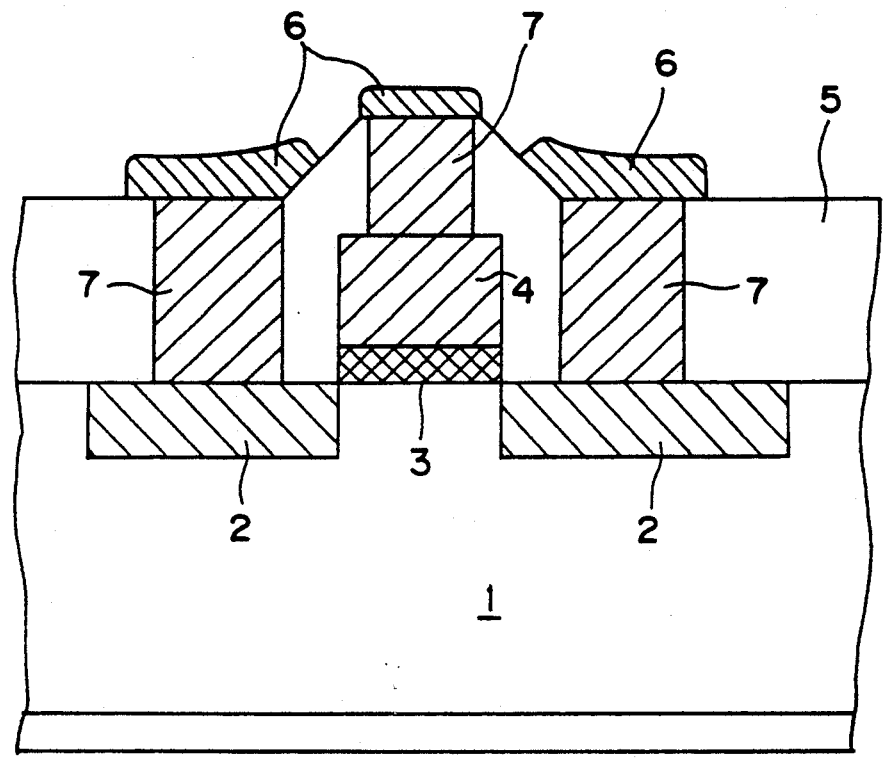
FIG. 1 is a sectional view showing one embodiment of a semiconductor apparatus of the present invention.

Before the description of the present invention proceeds, it is to be noted that like parts are designated by like reference numerals throughout the accompanying drawings.

Referring now to the drawings, there is shown in FIG. 1, a sectional view showing the construction SiC-MoS transistor in one embodiment of the present invention.

In order to obtain the SiCMoS transistor, the top face (1,1,1) of, first, a N type silicon carbide base plate (1) is oxidized to form an oxidized film 3 of approximately 100 nm.

Polysilicon 4 is grown to approximately 300 nm on the oxidized film 3 by a CVD method. Thereafter, the polysilicon 4 is left by GATE portion with an etching operation being performed.

Continuously, a source area, a drain area 2 are formed by an ion injection. The forming conditions are 50 keV in energy, $1 \times 10^{15}$ cm$^{-3}$ in dose amount by the use of boron ion.

Thereafter, an oxidized film 5 is deposited on the whole face by a CVD method. Gate, drain, source areas are etched so as to form a contact area.

Continuously, polysilicon 7 is grown on the whole face by approximately 500 nm by a CVD method.

Thereafter, the polysilicon is etched so as to leave the polysilicon only on the contact area.

Finally, Mo6 which is a high melting point metal is deposited by sputtering so as to effect an etching operation.

Through such steps as described hereinabove, wiring construction where the connection between the source layer, the drain layer of the silicon carbide basic plate as the wiring construction of the SiCMoS transistor, and the high melting point metal as wiring is effected through a polysilicon film can be provided.

Figure 2:
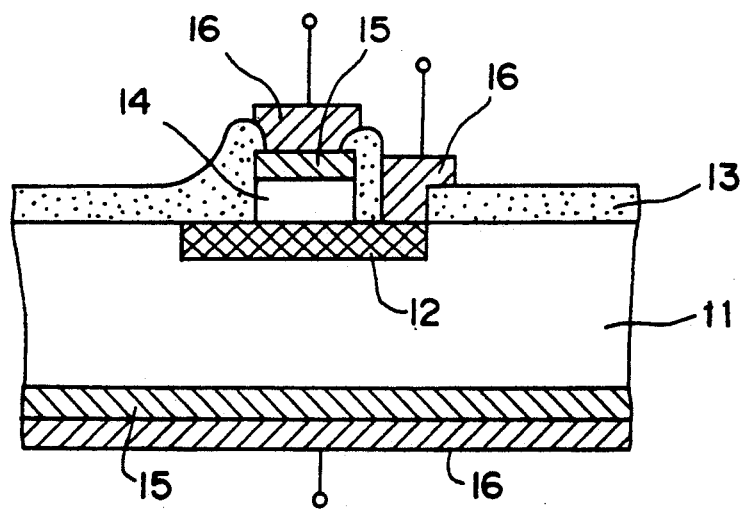
FIG. 2 is a sectional view showing the other embodiment of the semiconductor apparatus of the present invention.

FIG. 2 shows the section of a silicon carbide semiconductor apparatus, wherein reference numeral 11 shows a N type of Si base plate, reference numeral 12 is a P layer, reference numeral 13 is a SiO$_2$ film, reference numeral 14 is a N type $\beta$ - SiC, reference numeral 15 is a polysilicon, reference numeral 16 is a wiring of aluminum. The polysilicon is grown, formed by a CVD method.

As described in detail in the above described embodiment, the present invention can provide a semiconductor apparatus where connection is effected through the polysilicon between the semiconductor base plate and the wiring in the connection of the wiring with semicoductor basic plate using the silicon carbide.

As is clear from the foregoing description, according to the silicon carbide semiconductor apparatus of the present invention, the contact between the silicon carbide and the wiring metal can be made better with the connection through the polysilicon, and the contact better with respect to the wring can be given, with an advantage in that the environment-proof elements of SiC high in productivity and the hetero-junction bi-polar transistor can be formed.

Although the present invention has been fully described by way of example with reference to the accompanying drawings, it is to be noted here that various changes and modifications will be apparent to those skilled in the art. Therefore, unless otherwise such changes and modifications depart form the scope of the present invention, they should be construed as included therein.

What is claimed is:

1. A silicon carbide semiconductor device, comprising:

a silicon carbide semiconductor base plate having a principal surface;

an insulating film located along said principal surface of said silicon carbide semiconductor base plate and having a through hole formed therein;

an electrically conductive high concentration polysilicon layer located within said through hole of said insulating film and directly contacting said principal surface of said silicon carbide semiconductor base plate; and a wiring layer located along said insulating film and contacting said polysilicon layer, wherein said polysilicon film is interposed between said silicon carbide semiconductor base plate and said wiring layer and wherein said wiring layer is electrically connected with said silicon carbide semiconductor base plate via said polysilicon layer interposed therebetween.

2. The device of claim 1, wherein said wiring layer comprises Al, Mo or Ti.

3. The device of claim 2, wherein said silicon carbide semiconductor base plate comprises an N-type silicon carbide.

4. The device of claim 3, wherein said polysilicon layer contacts a diffusion region of an SiCMoS transistor, said diffusion region formed in said principal surface of said silicon carbide base plate.

* * * * *